United States Patent
Lee et al.

(10) Patent No.: US 7,653,113 B2
(45) Date of Patent: Jan. 26, 2010

(54) PUMP LASER INTEGRATED VERTICAL EXTERNAL CAVITY SURFACE EMITTING LASER

(75) Inventors: Sang-moon Lee, Suwon-si (KR); Jun-ho Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 11/980,350

(22) Filed: Oct. 31, 2007

(65) Prior Publication Data

US 2008/0123699 A1    May 29, 2008

(30) Foreign Application Priority Data

Nov. 28, 2006    (KR)    ........................ 10-2006-0118564

(51) Int. Cl.
*H01S 3/093* (2006.01)
(52) U.S. Cl. .............................. 372/72; 372/69; 372/70; 372/71; 372/97; 372/99
(58) Field of Classification Search ............. 372/68–72, 372/97, 99
See application file for complete search history.

(56) References Cited

U.S. PATENT DOCUMENTS

| | | | |
|---|---|---|---|
| 2002/0001328 A1* | 1/2002 | Albrecht et al. | ................ 372/50 |
| 2004/0141538 A1* | 7/2004 | Schmid et al. | ................ 372/70 |
| 2006/0251136 A1* | 11/2006 | Lee | ........................ 372/45.012 |

* cited by examiner

*Primary Examiner*—Minsun Harvey
*Assistant Examiner*—Yuanda Zhang
(74) *Attorney, Agent, or Firm*—Harness, Dickey & Pierce

(57) ABSTRACT

Provided is a pump laser integrated vertical external cavity surface emitting laser (VECSEL). The VECSEL may include a surface emitting laser unit including a first active layer having a multiple quantum well structure emitting light having a first wavelength, a reflective layer may be formed on the first active layer, and an external mirror may be disposed opposite to a lower surface of the first active layer and defining a cavity resonator together with the reflective layer. A pump laser unit may be formed on a part of the surface emitting laser unit and may have a perpendicular light emissive surface emitting a pump beam having a second wavelength for exciting the first active layer. A beam reflector may be formed on the light emissive surface of the pump laser unit and reflecta a pump beam that is incident from the pump laser unit to the first active layer.

21 Claims, 6 Drawing Sheets

_US 7,653,113 B2_

PUMP LASER INTEGRATED VERTICAL EXTERNAL CAVITY SURFACE EMITTING LASER

This U.S. non-provisional application claims the benefit of priority under 35 U.S.C. §119 to Korean Patent Application No. 10-2006-0118564, filed on Nov. 28, 2006, in the Korean Intellectual Property Office (KIPO), the disclosure of which is incorporated herein in its entirety by reference.

BACKGROUND

Description of the Related Art

Conventionally, vertical external cavity surface emitting lasers (VECSELs) may increase a gain region by adopting an external mirror instead of an upper mirror for a vertical cavity surface emitting laser (VCSEL), and may obtain a high output power of a few to several tens of watts (W) or higher.

FIG. 1 is a schematic cross-sectional view illustrating a conventional optical pumping type VECSEL 10. In FIG. 1, the conventional optical pumping type VECSEL 10 may include a distributed Bragg reflector (DBR) layer 12 and an active layer 13 that may be sequentially formed on a heat sink 11. An external mirror 14 may be disposed opposite to the active layer 13 and a pump laser 16 may provide a pump beam to excite the active layer 13. A second harmonic generation (SHG) crystal 15 may be further disposed between the active layer 13 and the external mirror 14. An SHG crystal 15 may double the frequency of light. The active layer 13 may have a multiple quantum well structure having, for example, a resonant periodic gain (RPG), and emit light having a predetermined wavelength exited by the pump beam. The heat sink 11 may dissipate heat generated from the active layer 13, and cool the active layer 13.

In the above-described structure, the pump laser 16 may irradiate light to the active layer 13 through lens arrays 17 with a shorter wavelength than that of light emitted from the active layer 13. When the active layer 13 is excited, light having a specific wavelength may be emitted. When the light is repeatedly reflected between the DBR layer 12 that is in a lower part of the active layer 13 and the external mirror 14, the light may resonate and accordingly. A cavity resonator may be formed between the DBR layer 12 and the external mirror 14. Through the above-described process, part of the light that is amplified in the active layer 13 may be output as a laser beam through the external mirror 14.

However, in the conventional VECSEL 10 having the above-described structure, the active layer 13 and the pump laser 16 may be separately manufactured and then combined to function with each other. In addition, the pump laser 15 may be formed so that light emitted from the pump laser 16 may be incident on the active layer 13 at an appropriate angle. The lens arrays 17 may be formed between the pump laser 16 and the active layer 13. As such, it may be difficult to mass-produce the conventional laser device, and the overall size of the laser device may increase, and/or manufacturing time and costs may also increase.

Accordingly, various attempts have been made to integrate a pump laser into a VECSEL. FIG. 2 is a schematic cross-sectional illustrating a conventional pump laser integrated into a VECSEL 20. In FIG. 2, the conventional pump laser that is integrated into the VECSEL 20 may include a conventional surface emitting laser unit 21, an n-contact 27 and a pump laser unit 22, which may be sequentially formed. A cavity resonator of the pump laser unit 22 may be formed between a side part of a high reflection mirror 24 and a DBR layer 26 of the surface emitting laser unit 21. The cavity resonator of the pump laser unit 22 may be folded with an inclined mirror 25.

In this structure, when a voltage is applied between the n-contact 27 and a p-contact 28 of the pump laser unit 22, an active layer 23 of the pump laser unit 22 may be excited to emit light having a predetermined wavelength. The light emitted from the active layer 23 of the pump laser unit 22 may resonate between the high reflection mirror 24 and the DBR layer 26 through the inclined mirror 25 and part of the amplified light may pass through the DBR layer 26, and is provided on the surface emitting laser unit 21 as a pump beam.

However, the light emitted from the active area 23 of the pump laser unit 22 may not proceed exactly parallel to the active area 23. Conventionally, because light proceeds while being totally reflected in the active area 23 at various angles, light reflected by the inclined mirror 25 and incident on the DBR layer 26 is not totally perpendicularly incident on the DBR layer 26 of the surface emitting laser unit 21. Accordingly, only a part of the light reflected by the DBR layer 26 may again be incident on the active area 23 of the pump laser unit 22 through the inclined mirror 25, and a large part of the light may be lost. Thus, the resonance efficiency of the pump laser unit 22 may be low, and it may be difficult to provide a pump beam having enough optical power to the surface emitting laser unit 21.

SUMMARY

Example embodiments provide a pump laser integrated vertical external cavity surface emitting laser (VECSEL) having improved efficiency.

According to an example embodiment, a vertical external cavity surface emitting laser (VECSEL) cavity surface may include a surface emitting laser unit including a first active layer having a multiple quantum well structure emitting light having a first wavelength, a reflective layer formed on the first active layer, and an external mirror disposed opposite to a lower surface of the first active layer and defining a cavity resonator together with the reflective layer. A pump laser unit may be formed on a part of the surface emitting laser unit and have a perpendicular light emissive surface emitting a pump beam having a second wavelength for exciting the first active layer of the surface emitting laser unit. A beam reflector may be formed on a light emissive surface of the pump laser unit and totally reflect a pump beam that is incident from the pump laser unit to the first active layer of the surface emitting laser unit.

In example embodiments, the pump laser unit may include an n-contact layer, an n-clad layer, a second active layer emitting light having the second wavelength, a p-clad layer and a p-contact layer which are sequentially formed on the reflective layer. A mirror may be formed on a side surface opposite to the light emissive surface of the pump laser unit. The mirror, together with the second active layer, may define a linear cavity resonator for resonating light having the second wavelength. The reflective layer may transmit the pump beam emitted from the pump laser unit to the first active layer and reflects the light emitted from the first active layer to the external mirror. The reflective layer may be a distributed Bragg reflector (DBR) layer formed by alternately stacking a pair of layers having different refractive indexes from each other. The beam reflector may be formed by depositing $SiO_2$ or $SiN_x$.

In example embodiments, the VECSEL may further include a substrate supporting the first active layer and disposed on a lower surface of the first active layer. A part of the substrate corresponding to a light path of the light having the first wavelength emitted from the first active layer proceeds may be cut and/or removed.

In example embodiments, the VECSEL may further include a second harmonic generation (SHG) crystal disposed between the first active layer and the external mirror that increases, or doubles, the frequency of light emitted from the first active layer. The external mirror may be a flat type external mirror having a flat reflective surface.

Two pump laser units may be formed on both sides of an upper surface of the surface emitting laser unit, respectively, so that light emissive surfaces of the two pump laser units are opposite to each other, and a common beam reflector is formed between the light emissive surfaces of the two pump laser units.

According to an example embodiment, a vertical external cavity surface emitting laser (VECSEL) may include a surface emitting laser unit including a first active layer having a multiple quantum well structure emitting light having a first wavelength, a reflective layer formed on the first active layer, and an external mirror disposed opposite to a lower surface of the first active layer and defining a cavity resonator together with the reflective layer. Two edge emitting pump laser units may be formed on both sides of the surface emitting laser unit, respectively, so as to be opposite to each other. A heat sink may be formed crossing upper surfaces of the two pump laser units and a reflective protrusion protruding from a lower surface of the heat sink may be formed in a space between the two pump laser units opposite to each other.

In example embodiments, each of the two pump laser units may have a perpendicular light emissive surface emitting a pump beam having a second wavelength for exciting the first active layer, and light emissive surfaces of the two pump laser units are formed opposite to each other.

Each of the two pump laser units may include an n-contact layer, an n-clad layer, a second active layer emitting light having the second wavelength, a p-clad layer and a p-contact layer that are sequentially formed on the reflective layer, and a mirror may be formed on a side surface opposite to each of the light emissive surfaces of the pump laser units.

The mirror together with the second active layer may define a linear cavity resonator for resonating light having the second wavelength.

The reflective layer may transmit the pump beam emitted from the pump laser unit to the first active layer and reflects the light emitted from the first active layer to the mirror.

The reflective layer may be a distributed Bragg reflector (DBR) layer formed by alternately stacking two layers having different refractive indexes from each other.

BRIEF DESCRIPTION OF THE DRAWINGS

The above and other features and advantages of the example embodiments be described with reference to the attached drawings in which.

DETAILED DESCRIPTION OF EXAMPLE EMBODIMENTS

Figure 1:
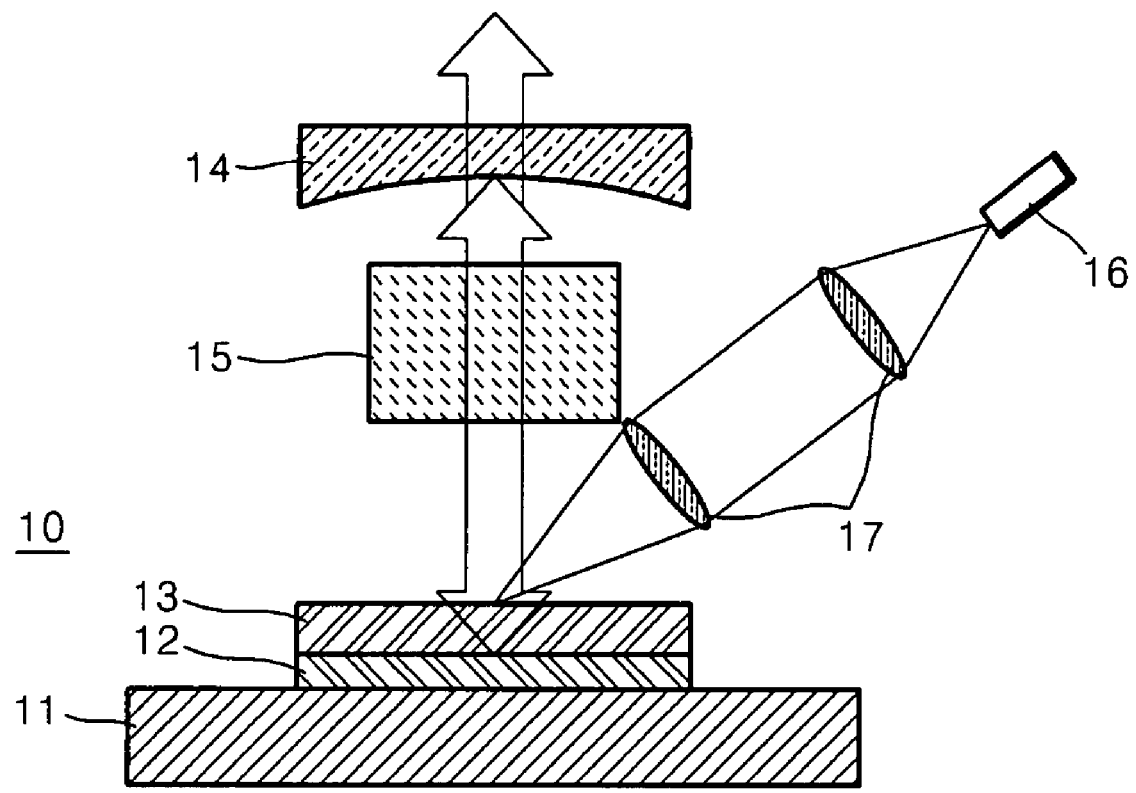
FIG. 1 is a schematic cross-sectional view illustrating a conventional optical pumping type vertical external cavity surface emitting laser (VECSEL)
Figure 2:
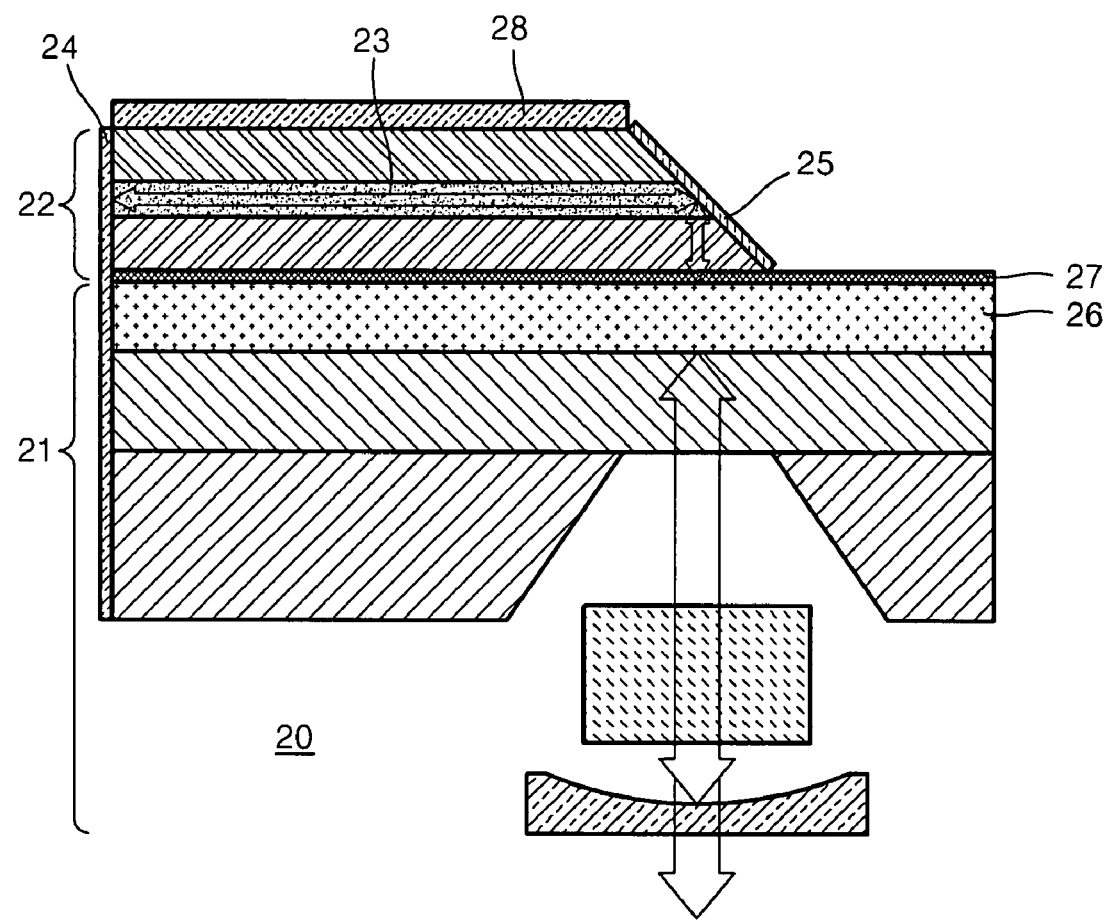
FIG. 2 is a schematic cross-sectional view illustrating a conventional pump laser integrated VECSEL.

Example embodiments will now be described more fully with reference to the accompanying drawings. Although example embodiments are set forth herein, other embodiments may be in many different forms and should not be construed as being limited to the example embodiments set forth herein. Rather, these example embodiments are provided so that this disclosure will be thorough and complete, and will fully convey the concept of the invention to those skilled in the art.

Accordingly, while example embodiments are capable of various modifications and alternative forms, example embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including" , when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
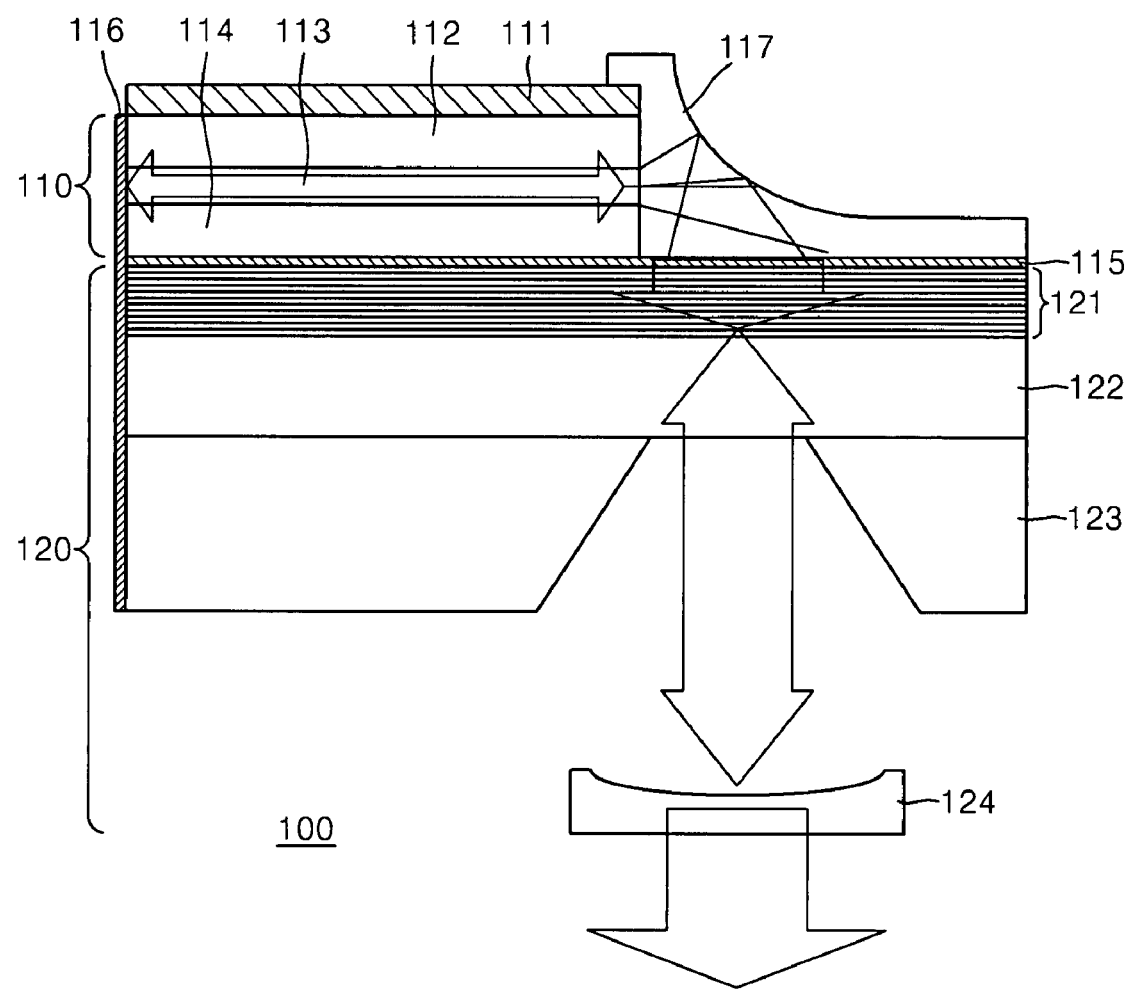
FIG. 3 is a schematic cross-sectional view illustrating a pump laser integrated VECSEL according to an example embodiment.

FIG. 3 shows a schematic cross-sectional view illustrating a pump laser integrated vertical external cavity surface emitting laser (VECSEL) 100 according to an example embodiment. In FIG. 3, the pump laser integrated VECSEL 100 may include a surface emitting laser unit 120 and a pump laser unit 110 integrated onto a part of the surface emitting laser unit 120.

The surface emitting laser unit 120 may include a first active layer 122 and a reflective layer 121, which may be sequentially stacked on a substrate 123. A concave external mirror 124 may be disposed below the substrate 123 separate from the first active layer 122 by a predetermined distance. The substrate 123 may be, for example, an n-doped semiconductor substrate, such as an n-GaAs substrate. The first active layer 122 may be excited by a pump beam provided by a pump laser unit 110 and may emit light having a predetermined wavelength. As well known to one skilled in the art, the first active layer 122 may have a multiple quantum well structure in which a plurality of quantum wells and barriers are alternately stacked.

The reflective layer 121 may reflect the light emitted from the first active layer 122 to the concave external mirror 124, and may define a cavity resonator in cooperation with the concave external mirror 124. Accordingly, the light emitted from the first active layer 122 may resonate between the reflective layer 121 and the concave external mirror 124. As well known to one skilled in the art, the reflective layer 121 may be a distributed Bragg reflector (DBR) layer having a multi-layered structure, which is formed by alternately stacking a pair of layers having different refractive indexes from each other. For example, a high refractive index layer having a relatively high refractive index may be formed of a compound semiconductor, such as a GaAs semiconductor, and a low refractive index layer having a relatively low refractive index may be formed of a compound semiconductor, such as an AlAs semiconductor. In addition, the reflective layer 121 may have a multi-layered structure formed of a dielectric material such as $TiO_2/SiO_2$ instead of the DBR layer.

The pump laser unit 110 may be formed on a portion of the surface emitting laser unit 120. The pump laser unit 110 may include an n-contact 115 formed on the reflective layer 121, an n-clad layer 114 formed on the n-contact 115, a second active layer 113 formed on the n-clad layer 114, a p-clad layer 112 formed on the second active layer 113 and a p-contact 111 formed on the p-clad layer 112. A voltage may be applied to the n-contact 115 and the p-contact 111 to excite the second active layer 113. As shown in example embodiments of FIG. 3, the n-contact 115 may be formed on an entire surface of the reflective layer 121, and the n-clad layer 114 may be formed on a part of the n-contact 115. However, the n-contact 115 may be formed on a portion of the reflective layer 121, and the n-clad layer 114 may be formed on an entire surface of the n-contact 115. As such, the second active layer 113 may generate a pump beam for exciting the first active layer 122. In addition, the n-clad layer 114 and the p-clad layer 112 may provide electrons and holes to the second active layer 113, respectively.

According to an example embodiment as illustrated in FIG. 3, a high reflection mirror 116 may be perpendicularly formed on a side of at least the n-clad layer 114, the second active layer 113 and the p-clad layer 112. The high reflection mirror 116 may be designed to have a high reflectivity with light generated from the second active layer 113, and may be, for example, a dielectric mirror such as an $SiO_2$ mirror. In addition, the other side of at least the n-clad layer 114, the second active layer 113 and the p-clad layer 112 may be perpendicularly etched. For example, the n-contact 115, the n-clad layer 114, the second active layer 113, the p-clad layer 112 and/or the p-contact 111 may be sequentially stacked on an entire surface of the reflective layer 121 and the n-clad layer 114, the second active layer 113, the p-clad layer 112 and the p-contact 111 may be perpendicularly etched using the n-contact 115 as an etch stopping layer.

A beam reflector 117, which may be formed of a material having a relatively low refractive index of about 1.4 through 1.6, such as $SiO_2$ and $SiN_x$, may be formed on the other side of the pump laser unit 110 that may be perpendicularly etched, (e.g., a light emissive surface of the pump laser unit 110). The beam reflector 117 may be formed on the n-contact 115 and the perpendicularly etched side surface (e.g., light emissive surface of the pump laser unit 110) by angle deposition of $SiO_2$, $SiN_x$ or the like using a plasma enhanced chemical vapor deposition (PECVD) method or an E-beam deposition method. As illustrated in FIG. 3, when angle depositing $SiO_2$, $SiN_x$ or the like using the above methods, the beam reflector 117 may be formed with a smoothly concave curve.

In an example embodiment, an interface between the second active layer 113 and the beam reflector 117 may function as a mirror having a reflectivity of about 20% through 25% due to a refractive index difference between the second active layer 113 and the beam reflector 117. Accordingly, the light emitted from the second active layer 113 may resonate between the interface between the second active layer 113 and the beam reflector 117 and the high reflection mirror 116. In other words, the high reflection mirror 116 may define a cavity resonator of the pump laser unit 110 in cooperation with the interface between the second active layer 113 and the beam reflector 117. Therefore, the pump laser unit 110 may have an edge emitting laser structure. In addition, the cavity resonator of the pump laser unit 110 may be a linear cavity resonator in which resonating light is not folded therein.

The pump laser integrated VECSEL 100 having the above-described structure may be operated as follows.

A voltage may be applied to the n-contact 115 and the p-contact 111 of the pump laser unit 110, so that electrons and holes provided by the n-clad layer 114 and/or the p-clad layer 112, respectively, may be recombined in the second active layer 113 to emit light. The light may resonate when the light emitted from the second active layer 113 is repeatedly reflected between the interface between the second active layer 113 and the beam reflector 117 and the high reflection mirror 116. Part of the light that is amplified in the second active layer 113 through the above-described process may pass through the interface between the second active layer 113 and the beam reflector 117 to be incident on the beam reflector 117. A pump beam may be totally reflected at an interface between an outer surface of the beam reflector 117 and the outside so as to be incident on the reflective layer 121.

The pump beam incident on the reflective layer 121 may transmit through the reflective layer 121. To achieve transmission through the reflective layer, the reflective layer 121 may be designed to have a low reflectivity with respect to the wavelength of the pump beam incident on the reflective layer 121 and a high reflectivity with respect to the wavelength of the light generated from the first active layer 122 by adjusting the thicknesses and the number of stacks of materials constituting the multi-layered structure of the DBR layer, as may be well known to one skilled in the art. For example, the reflective layer 121 may be designed to have a low reflectivity with respect to light having a wavelength of about 808 nm and high reflectivity with respect to light having a wavelength of about 920 nm or 1060 nm.

The pump beam transmitted through the reflective layer 121 may be incident on the first active layer 122 and when the first active layer 122 is excited, light having a predetermined wavelength may be emitted. The light emitted from the first active layer 122 may be repeatedly reflected between the reflective layer 121 and the concave external mirror 124 to resonate. As a result, part of the light amplified in the first active layer 122 may be output through the concave external mirror 124 as a laser beam.

The substrate 123 may be formed between the first active layer 122 and the concave external mirror 124. Accordingly, to reduce or prevent the reduction of optical power due to the substrate 123, a portion of the substrate 123 corresponding to a light path of the light emitted from the first active layer 122 may be cut and/or removed, as illustrated in FIG. 3. However, the structure illustrated in FIG. 3 is not limited thereto and may be altered accordingly. Hence, it is understood by one of ordinary skill in the art that the sequentially stacked elements from the p-contact 111 to the first active layer 122 on the substrate 123 as illustrated in FIG. 3 may be inversely formed on the substrate 123.

Figure 4:
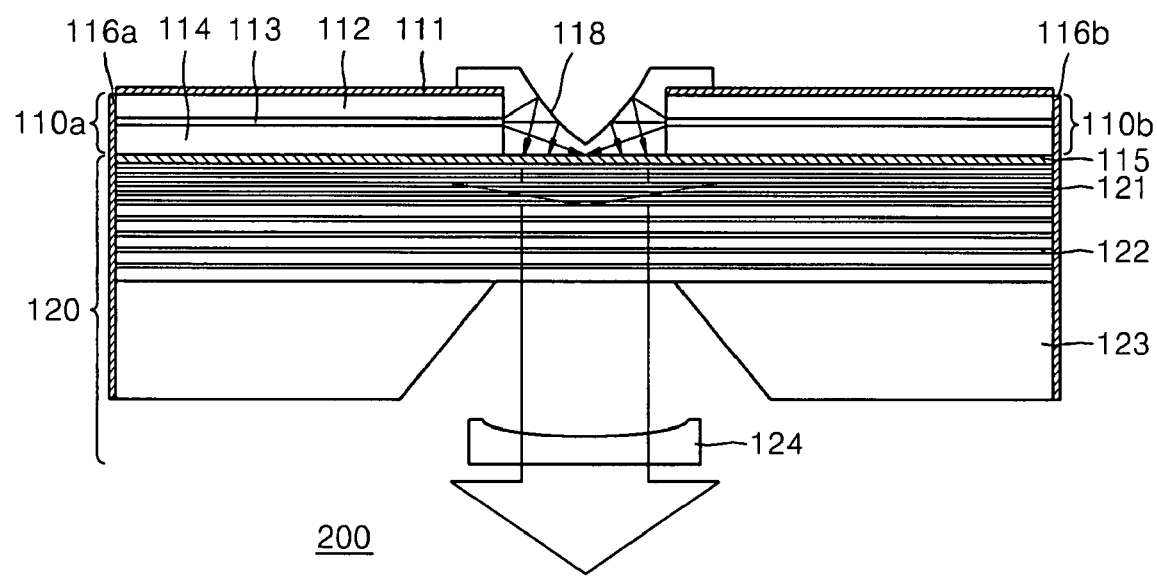
FIG. 4 is a schematic cross-sectional view illustrating a pump laser integrated VECSEL according to an example embodiment.

FIG. 4 shows a schematic cross-sectional view illustrating a pump laser integrated VECSEL 200 according to an example embodiment. In FIG. 3, the pump laser unit 110 may be formed on the surface emitting laser unit 120. However, in FIG. 4, a pump laser unit 110a and a pump laser unit 110b may be formed opposite to each other on both sides of an upper portion of a surface emitting laser unit 120, respectively. In example embodiments, each of the surfaces of the pump laser units 110a and 110b may be light emissive surfaces. It may be understood by one of ordinary skill in the art that a plurality of pump lasers may be disposed on a center portion of a surface emitting laser unit 120. Thus, the intensity of the pump beam provided on a reflective layer 121 may be easily increased.

In example embodiments, the pump laser integrated VECSEL 200 may be formed by sequentially stacking an n-contact 115, an n-clad layer 114, a second active layer 113, a p-clad layer 112, and/or a p-contact 111 on the reflective layer 121. Center portions of the n-clad layer 114, the second active layer 113, the p-clad layer 112 and/or the p-contact 111 may be perpendicularly etched by using the n-contact 115 as an etch stopping layer. In example embodiments, to form cavities in the pump laser units 110a and 110b, respectively, a first high reflective mirror 116a and second high reflective mirror 116b may be formed on outer surfaces of the pump laser units 110a and 110b, respectively. A common beam reflector 118 may be formed between opposite inner surfaces of the pump laser units 110a and 110b. The common beam reflector 118 may be formed on the n-contact 115 and the opposite inner surfaces of the pump laser units 110a and 110b by perpendicularly depositing $SiO_2$, $SiN_x$ or the like using a PECVD method or an E-beam deposition method. As illustrated in FIG. 4, a concave curve may be smoothly formed on the beam reflector 118.

Figure 5:
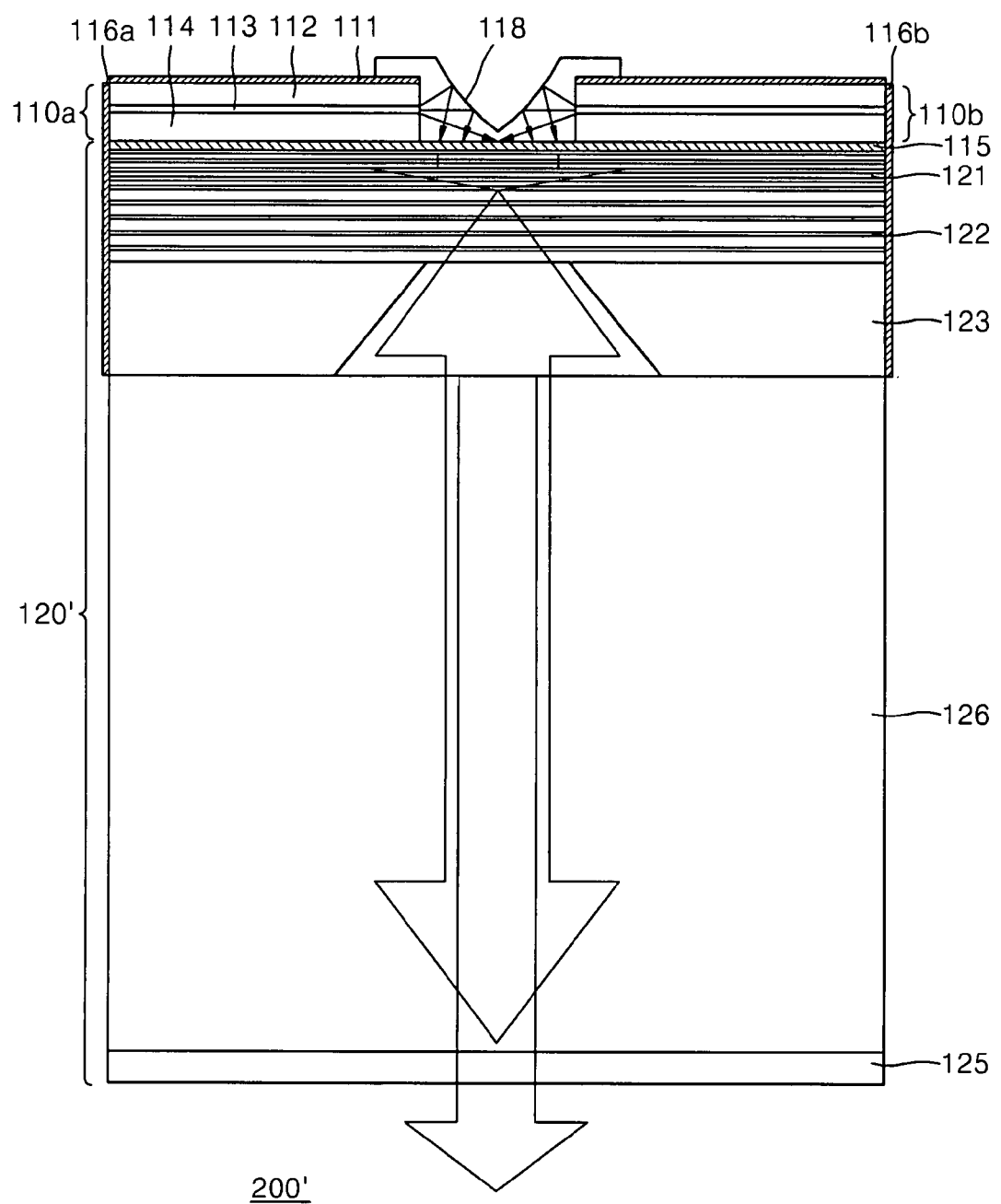
FIG. 5 is a schematic cross-sectional view illustrating a pump laser integrated VECSEL according to an example embodiment.

FIG. 5 shows a schematic cross-sectional view illustrating a pump laser integrated VECSEL 200' according to an example embodiment. In FIG. 5, a flat type external mirror 125 in the pump laser integrated VECSEL 200' may be substituted for the concave external mirror 124 of the pump laser integrated VECSEL 200 of FIG. 4. A SHG crystal 126 may be disposed between the flat type external mirror 125 and the substrate 123. When an SHG crystal 126 is used, light having a short wavelength may be emitted. For example, when a first active layer 122 is a nitride semiconductor, infrared light having a wavelength of 900 to 1300 nm may be emitted. Accordingly, by using the SHG crystal 126, visible rays having a wavelength in the range of about 450 to 650 nm from a blue color region to a red color region may be emitted. According to example embodiments, because a flat type mirror may be used as the flat type external mirror 125, an entire laser system including the flat type external mirror 125 and the SHG crystal 126 may be manufactured using a more simple method, and may be mass-produced with reduced manufacturing costs.

Figure 6:
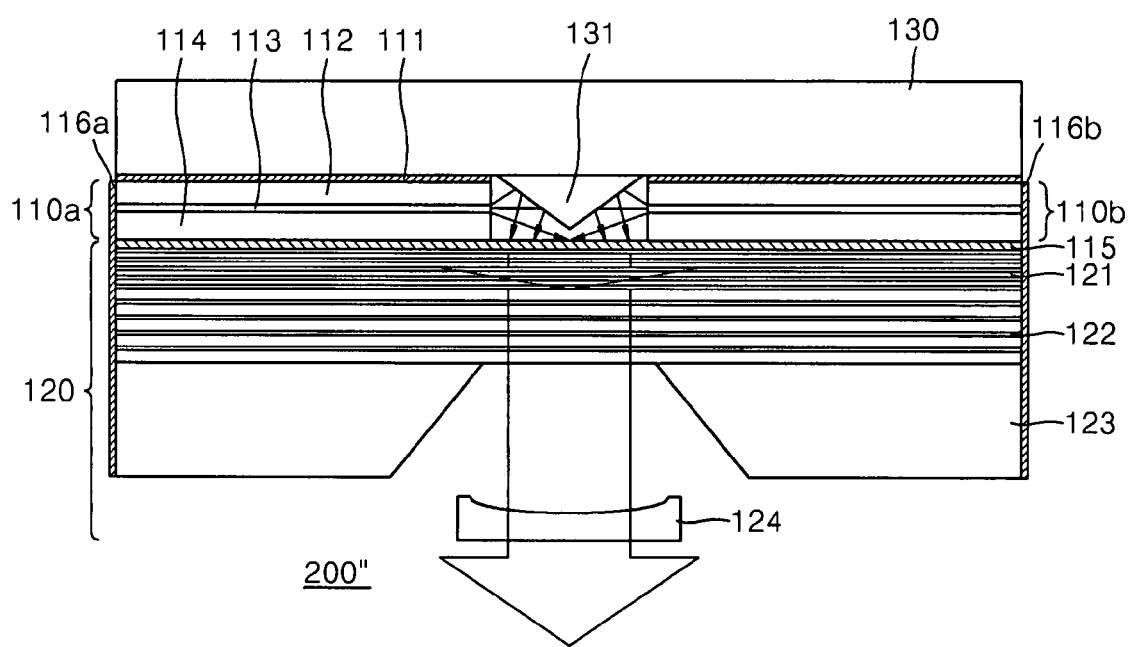
FIG. 6 is a schematic cross-sectional view illustrating a pump laser integrated VECSEL according to an example embodiment.

FIG. 6 shows a schematic cross-sectional view illustrating a pump laser integrated VECSEL 200" according to an example embodiment. In FIG. 6, the pump laser integrated VECSEL 200" may include a heat sink 130 formed on the pump laser integrated VECSEL 200 of FIG. 4. For example, the heat sink 130 may be formed crossing upper surfaces of the pump laser units 110a and 110b. The heat sink 130 may dissipate heat generated from the surface emitting laser unit 120 or the pump laser units 110a and 110b, and may be made of a metal, for example, Al or Cu.

In example embodiments, a reflective protrusion 131 may be used in the pump laser integrated VECSEL 200" that protrudes from a lower surface of the heat sink 130 instead of the common beam reflector 118 as shown in FIG. 4. As illustrated in FIG. 6, the reflective protrusion 131 protruding from the lower surface of the heat sink 130 may be formed in a space between the pump laser units 110a and 110b that are opposite to each other. Because a complicated method such as a PECVD method or an E-beam deposition method is not used, and the heat sink 130 including the reflective protrusion 131 formed thereon and the pump laser unit 110 are flip-chip bonded, the pump laser integrated VECSEL 200" may be more easily manufactured. In example embodiments, a surface of the reflective protrusion 131 may be polished so that the reflective protrusion 131 may have sufficient reflectivity without diffusing incident light thereon.

According to example embodiments, a cavity resonator of the pump laser units 110a and 110b may be formed between an interface (e.g., light emissive surface) between a second active layer 113 and the outside and high reflective mirrors 116a and 116b. When the light emissive surface of the second active layer 113 does not contact a beam reflector 117 formed of $SiO_2$, $SiN_x$ or the like, the reflectivity of the interface between the second active layer 113 and the outside may be about 30%.

According to a pump laser integrated VECSEL of example embodiments, a pump laser unit and a surface emitting laser unit may be integrally manufactured using a single process. Accordingly, a complicated process of accurately arranging a pump laser and a lens array may not be required. Therefore, the manufacturing method of such a laser device may be simpler, and/or the laser device may be inexpensively mass-produced. In addition, the size of the laser device may be reduced compared to a conventional laser device.

According to example embodiments, because the pump laser unit may include a linear cavity resonator unlike a conventional pump laser integrated VECSEL, the efficiency of the pump laser may be improved. For example, because a plurality pump lasers may be provided on the pump laser integrated VECSEL, higher input may be provided on the surface emitting unit as compared to the conventional pump laser integrated VECSEL.

While example embodiments have been particularly shown and described with reference to figures, it will be understood by one of ordinary skill in the art that various changes in form and details may be made without departing from the spirit and scope of the example embodiments as defined by the following claims.

What is claimed is:

1. A vertical external cavity surface emitting laser (VECSEL) cavity surface, comprising:
   a surface emitting laser unit including a first active layer having a multiple quantum well structure emitting light having a first wavelength, a reflective layer on a surface of the first active layer, and a first mirror opposite to a surface of the first active layer and defining a first cavity resonator together with the reflective layer;
   at least one pump laser unit located on an upper surface of the surface emitting laser unit, the at least one pump laser unit having a perpendicular light emissive surface and a second cavity resonator perpendicular to the first cavity resonator; and
   a beam reflector configured to reflect a light having a second wavelength emitted from the pump laser unit toward the surface emitting laser unit, wherein
      the beam reflector is formed on the perpendicular light emissive surface of the pump laser unit so as to have an inner reflecting surface in contact with the perpendicular light emissive surface and a concavely curved outer reflecting surface located outside of the first and second cavity resonators.

2. The VECSEL of claim 1, wherein the at least one pump laser unit comprises an n-contact layer, an n-clad layer, a second active layer emitting light having the second wavelength, a p-clad layer and a p-contact layer formed on the reflective layer, and a second mirror is located on a side surface opposite to the light emissive surface of the at least one pump laser unit.

3. The VECSEL of claim 2, wherein the second mirror together with the second active layer border the second cavity resonator that resonates light having the second wavelength.

4. The VECSEL of claim 1, wherein the reflective layer transmits the pump beam emitted from the at least one pump laser unit to the first active layer and reflects light emitted from the first active layer to the first mirror.

5. The VECSEL of claim 4, wherein the reflective layer is a distributed Bragg reflector (DBR) layer having alternately stacking a pair of layers having different refractive indexes from each other.

6. The VECSEL of claim 2, wherein the beam reflector includes $SiO_2$ or $SiN_X$ deposited on a surface of the n-contact layer of the at least one pump laser unit.

7. The VECSEL of claim 1, further comprising:
   a substrate supporting the first active layer on a lower surface of the first active layer.

8. The VECSEL of claim 7, wherein a portion of the substrate corresponding to a light path of the light having the first wavelength emitted from the first active layer is removed.

9. The VECSEL of claim 1, further comprising:
   a second harmonic generation (SHG) crystal between the first active layer and the first mirror that increases a frequency of light emitted from the first active layer.

10. The VECSEL of claim 9, wherein the first mirror is a flat type external mirror having a flat reflective surface.

11. The VECSEL of claim 1, wherein a plurality of pump laser units are located on an upper surface of the surface emitting laser unit such that light emissive surfaces of the plurality of pump laser units are opposite to each other, and the beam reflector is located between the light emissive surfaces of the plurality of pump laser units.

12. The VECSEL of claim 11, further comprising:
   a second harmonic generation (SHG) crystal between the first active layer and the first mirror that increases a frequency of light generated from the first active layer.

13. The VECSEL of claim 12, wherein the first mirror is a flat type external mirror having a flat reflective surface.

14. The VECSEL of claim 1, wherein the perpendicular light emissive surface emits a pump beam having the second wavelength, and the second wavelength excites the first active layer of the surface emitting laser unit.

15. The VECSEL of claim 1, wherein the beam reflector reflects substantially all of the pump beam that is incident from the at least one pump laser unit to the first active layer of the surface emitting laser unit.

16. A vertical external cavity surface emitting laser (VECSEL) comprising:
   a surface emitting laser unit including a first active layer having a multiple quantum well structure emitting light having a first wavelength, a reflective layer on a surface of the first active layer, and a first mirror located opposite to a surface of the first active layer and defining a first cavity resonator together with the reflective layer;
   two pump laser units located on the surface emitting laser unit opposite to each other, the two pump laser units having a perpendicular light emissive surface and a second cavity resonator perpendicular to the first cavity resonator;
   a heat sink crossing upper surfaces of the two pump laser units; and
   a beam reflector having a reflecting surface located outside of the first cavity resonator and the second cavity resonator, wherein the beam reflector protrudes from a lower surface of the heat sink formed in a space between the two pump laser units.

17. The VECSEL of claim 16, wherein the perpendicular light emissive surface emits a pump beam having a second wavelength that excites the first active layer, and the light emissive surfaces of the two pump laser units are opposite to each other.

18. The VECSEL of claim 17, wherein each of the two pump laser units includes an n-contact layer, an n-clad layer, a second active layer emitting light having the second wavelength, a p-clad layer and a p-contact layer on the reflective layer, and a second mirror is located on a side surface opposite to each of the light emissive surfaces of the pump laser units.

19. The VECSEL of claim 18, wherein the second mirror together with the second active layer border the second cavity resonator that resonates light having the second wavelength.

20. The VECSEL of claim 16, wherein the reflective layer transmits the pump beam emitted from the two pump laser units to the first active layer and reflects light emitted from the first active layer to the first mirror.

21. The VECSEL of claim 20, wherein the reflective layer is a distributed Bragg reflector (DBR) layer formed by alternately stacking two layers having different refractive indexes from each other.

* * * * *